(12) United States Patent
Wang

(10) Patent No.: US 10,319,293 B2
(45) Date of Patent: Jun. 11, 2019

(54) CIRCUIT AND METHOD FOR DRIVING AMOLED PIXEL

(71) Applicant: Shenzhen China Star Optoelectronics Technology Co., Ltd., Shenzhen (CN)

(72) Inventor: Limin Wang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/328,510

(22) PCT Filed: Jan. 10, 2017

(86) PCT No.: PCT/CN2017/070693
§ 371 (c)(1),
(2) Date: Dec. 6, 2017

(87) PCT Pub. No.: WO2018/040471
PCT Pub. Date: Mar. 8, 2018

(65) Prior Publication Data
US 2018/0197467 A1    Jul. 12, 2018

(30) Foreign Application Priority Data
Aug. 31, 2016  (CN) .......................... 2016 1 0795545

(51) Int. Cl.
*G09G 3/3225* (2016.01)
*H03K 17/30* (2006.01)
*H03K 17/687* (2006.01)

(52) U.S. Cl.
CPC ......... *G09G 3/3225* (2013.01); *H03K 17/302* (2013.01); *G09G 2300/0809* (2013.01);
(Continued)

(58) Field of Classification Search
USPC ........................................................ 345/214
See application file for complete search history.

(56) References Cited

U.S. PATENT DOCUMENTS

2006/0290614 A1* 12/2006 Nathan ................ G09G 3/3233
345/76
2008/0211397 A1* 9/2008 Choi .................... G09G 3/3233
313/504
(Continued)

FOREIGN PATENT DOCUMENTS

CN    101079233 A    11/2007
CN    101800026 A     8/2010
(Continued)

OTHER PUBLICATIONS

Machine translation of CN101079233A by Lexis Nexis Total Patent on May 22, 2018.
(Continued)

*Primary Examiner* — Chineyere D Wills-Burns

(57) ABSTRACT

The present disclosure provides a circuit and a method for driving AMOLED pixels, The circuit includes a first transistor; a second transistor; a gray-scale storage capacitor; and a threshold storage capacitor, one end thereof being connected to the other end of the gray-scale storage capacitor, and the other end thereof being connected to a drain of the second transistor for storing a threshold voltage of the second transistor.

6 Claims, 8 Drawing Sheets

(52) U.S. Cl.
CPC ............... *G09G 2300/0842* (2013.01); *G09G 2300/0876* (2013.01); *G09G 2310/0262* (2013.01); *G09G 2310/067* (2013.01); *G09G 2320/045* (2013.01); *H03K 17/6871* (2013.01)

(56) References Cited

U.S. PATENT DOCUMENTS

| | | | | |
|---|---|---|---|---|
| 2008/0211746 A1* | 9/2008 | Caligiore | ............. | G09G 3/3233 345/76 |
| 2009/0051676 A1* | 2/2009 | Cho | ............. | G09G 3/20 345/211 |
| 2009/0115707 A1 | 5/2009 | Park | | |
| 2010/0245402 A1 | 9/2010 | Choi | | |
| 2014/0049568 A1* | 2/2014 | Qi | ............. | G09G 3/3258 345/690 |
| 2014/0071114 A1* | 3/2014 | Kim | ............. | G11C 19/28 345/212 |
| 2016/0189606 A1* | 6/2016 | Chen | ............. | G09G 3/3233 345/214 |
| 2016/0307502 A1* | 10/2016 | Nie | ............. | G09G 3/3233 |

FOREIGN PATENT DOCUMENTS

| | | |
|---|---|---|
| CN | 101908316 A | 12/2010 |
| CN | 102654976 A | 9/2012 |
| CN | 202422687 U | 9/2012 |
| CN | 102982767 A | 3/2013 |
| CN | 103310732 A | 9/2013 |
| CN | 103927984 A | 7/2014 |
| CN | 104008726 A | 8/2014 |
| CN | 106128363 A | 11/2016 |

OTHER PUBLICATIONS

Machine translation of CN101800026A by Lexis Nexis Total Patent on May 22, 2018.
Machine translation of CN101908316A by Lexis Nexis Total Patent on May 22, 2018.
Machine translation of CN102654975A by Lexis Nexis Total Patent on May 22, 2018.
Machine translation of CN102982767A by Lexis Nexis Total Patent on May 22, 2018.
Machine translation of CN103310732A by Lexis Nexis Total Patent on May 22, 2018.
Machine translation of CN103927984A by Lexis Nexis Total Patent on May 22, 2018.
Machine translation of CN104008726A by Google Translate on May 22, 2018.
Machine translation of CN106128363A by Lexis Nexis Total Patent on May 22, 2018.
Machine translation of CN202422687U by Lexis Nexis Total Patent on May 22, 2018.
Written Opinion and International Search Report issued in related PCT/CN2017/070693 dated May 2, 2017.

* cited by examiner

CIRCUIT AND METHOD FOR DRIVING AMOLED PIXEL

CROSS-REFERENCE TO RELATED APPLICATIONS

The present application claims priority of Chinese patent application CN201610795545.5, entitled "Circuit and Method for Driving AMOLED Pixel" and filed on Aug. 31, 2016, the entirety of which is incorporated herein by reference.

FIELD OF THE INVENTION

The present disclosure relates to the technical field of organic light-emitting diode (LED) display controlling, and particularly to a circuit and a method for driving active-matrix organic light-emitting diode (AMOLED) pixel.

BACKGROUND OF THE INVENTION

Active-matrix organic light-emitting diode (AMOLED) display devices have advantages such as a light and thin design, active light emission, a wide viewing angle, and a fast response speed, and are new display devices that have broad development prospects. However, due to manufacture procedures, materials, and the like, uniformity of brightness of the OLED display devices is poor, and this has always been a big problem that affects development of AMOLED display devices.

FIG. 1 is a schematic structural diagram of an AMOLED pixel drive circuit in the prior art. The drive circuit has a 2T1C structure. T1 is a switching transistor, T2 is a drive transistor, Cst is a gray-scale storage capacitor, and an OLED is an organic light-emitting diode. When a scanning line G outputs a scanning signal, and the transistor T1 is turned on, a gray-scale data signal Vdata charges the gray-scale storage capacitor Cst through the transistor T1. When the gray-scale storage capacitor Cst is charged to a predetermined value, the transistor T2 is turned on, and a drive signal ELVDD lightens the OLED through the transistor T2.

A current formula of the OLED in the AMOLED is shown as follows:

$$I_{oled} = \frac{1}{2}\mu_n C_{ox} \frac{W}{L}(V_{sg} - V_{th})^2,$$

wherein $\mu_n$ represents carrier (electron) mobility ratio (cm$^2$/V·s); $c_{ox}$ represents gate oxide unit-area capacitance (F/cm$^2$);

$$\frac{W}{L}$$

represents a width-length ratio of the drive transistor; $V_{sg}$ represents a voltage difference between a source S and a gate G of the drive transistor; and $V_{th}$ represents a threshold voltage (V) of the drive transistor, and an absolute value is taken.

According to the formula, it can be seen that, a threshold voltage Vth of the transistor T2 has an obvious effect on current of the OLED. In order to improve uniformity of brightness of a panel, the threshold voltage Vth of the transistor T2 needs to be compensated.

SUMMARY OF THE INVENTION

In order to solve the aforesaid technical problem, the present disclosure provides a circuit and a method for driving an AMOLED pixel, whereby uniformity of brightness of pixel display can be improved.

According to one aspect, the present disclosure provides a circuit for driving an AMOLED pixel, which comprises:

a first transistor, a source thereof being configured to input a gray-scale voltage, and a gate thereof being configured to input a first control signal;

a second transistor, a gate thereof being connected to a drain of the first transistor, and a source thereof being configured to input a drive voltage so as to drive an OLED;

a gray-scale storage capacitor, one end thereof being connected to the drain of the first transistor for storing the gray-scale voltage; and a threshold storage capacitor, one end thereof being connected to the other end of the gray-scale storage capacitor, and the other end thereof being connected to a drain of the second transistor for storing a threshold voltage of the second transistor, wherein the threshold voltage of the second transistor is compensated by superposing voltages on two ends of the threshold storage capacitor and the gray-scale storage capacitor.

According to one embodiment of the present disclosure, the circuit further comprises:

a third transistor, arranged between the gray-scale storage capacitor and the threshold storage capacitor, a source thereof being connected to the gray-scale storage capacitor, a drain thereof being connected to the threshold storage capacitor, and a gate thereof being configured to input a second control signal;

a fourth transistor, arranged between the threshold storage capacitor and the drain of the second transistor, a source thereof being connected to the threshold storage capacitor, a drain thereof being connected to the drain of the second transistor, and a gate thereof being configured to input the second control signal;

a fifth transistor, a source thereof being connected to the source of the fourth transistor, a drain thereof being connected to ground, and a gate thereof being configured to input a fourth control signal.

a sixth transistor, a source thereof being configured to input a reference voltage, a drain thereof being connected to the drain of the first transistor, and a gate thereof being configured to input a third control signal;

a seventh transistor, a source thereof being configured to input the reference voltage, a drain thereof being connected to the source of the third transistor, and a gate thereof being configured to input the third control signal; and an eighth transistor, a source thereof being connected to the source of the third transistor, a drain thereof being connected to ground, and a gate thereof being configured to input the first control signal.

According to one embodiment of the present disclosure, a cathode of the OLED is connected to the source of the second transistor, and an anode thereof is configured to input a drive voltage.

According to one embodiment of the present disclosure, a phase of the first control signal is opposite to that of the second control signal, and a phase of the third control signal is opposite to that of the fourth control signal.

According to one embodiment of the present disclosure, the first control signal, the second control signal, the third control signal, and the fourth control signal are all external input signals.

According to one embodiment of the present disclosure, the circuit further comprises a phase inverter, wherein the first control signal and the third control signal are external input signals; and wherein the second control signal is obtained after phase inversion of the first control signal performed by the phase inverter, and the fourth control signal is obtained after phase inversion of the third control signal performed by the phase inverter.

According to another aspect, the present disclosure further provides a method for driving an AMOLED pixel, which comprises following steps:

detecting a threshold voltage of the second transistor in each pixel and storing the threshold voltage in a corresponding threshold storage capacitor;

inputting a gray-scale voltage into the first transistor of each pixel, and storing the gray-scale voltage in a corresponding gray-scale storage capacitor; and superposing voltages on two ends of the threshold storage capacitor and the gray-scale storage capacitor so as to compensate the threshold voltage of the second transistor.

According to one embodiment of the present disclosure, in the step of storing the threshold voltage in a corresponding threshold storage capacitor, the first control signal and the fourth control signal are set in a low-level state, while the second control signal and the third control signal are set in a high-level state; in each pixel, the first transistor, the fifth transistor, and the eighth transistor are turned off, while the second transistor, the third transistor, the fourth transistor, the sixth transistor, and the seventh transistor are turned on.

According to one embodiment of the present disclosure, in the step of storing the gray-scale voltage in a corresponding gray-scale storage capacitor, the first control signal and the fourth control signal are set in a high-level state, while the second control signal and the third control signal are set in a low-level state; at this time, in each pixel, the third transistor, the fourth transistor, the sixth transistor, and the seventh transistor are turned off, while the first transistor, the second transistor, the fifth transistor, and the eighth transistor are turned on.

According to one embodiment of the present disclosure, in the step of compensating the threshold voltage of the second transistor, the second control signal and the fourth control signal are set in a high-level state, while the first control signal and the third control signal are set in a low-level state; at this time, in each pixel, the first transistor, the sixth transistor, the seventh transistor, and the eighth transistor are turned off, while the second transistor, the third transistor, the fourth transistor, and the fifth transistor are turned on.

The following beneficial effects can be brought about according to the present disclosure.

According to the present disclosure, the threshold voltage Vth of the drive transistor in an AMOLED display device can be compensated, so that the influence on a display effect of the display device brought about by the non-uniformity of the Vth that is caused in manufacturing procedure and the non-uniform changing of Vth with time can be eliminated. In addition, according to the present disclosure, a time-sequence waveform for driving is simple and can be easily realized.

Other advantages, objectives, and features of the present disclosure will be illustrated in subsequent description to some extent, and to some extent, will be obvious to a person skilled in the art based on observational study in the following text, or can be taught by practice of the present disclosure. Objectives and other advantages of the present disclosure can be implemented and obtained according to the structure specifically pointed out in the description, claims, and drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Figure 1:
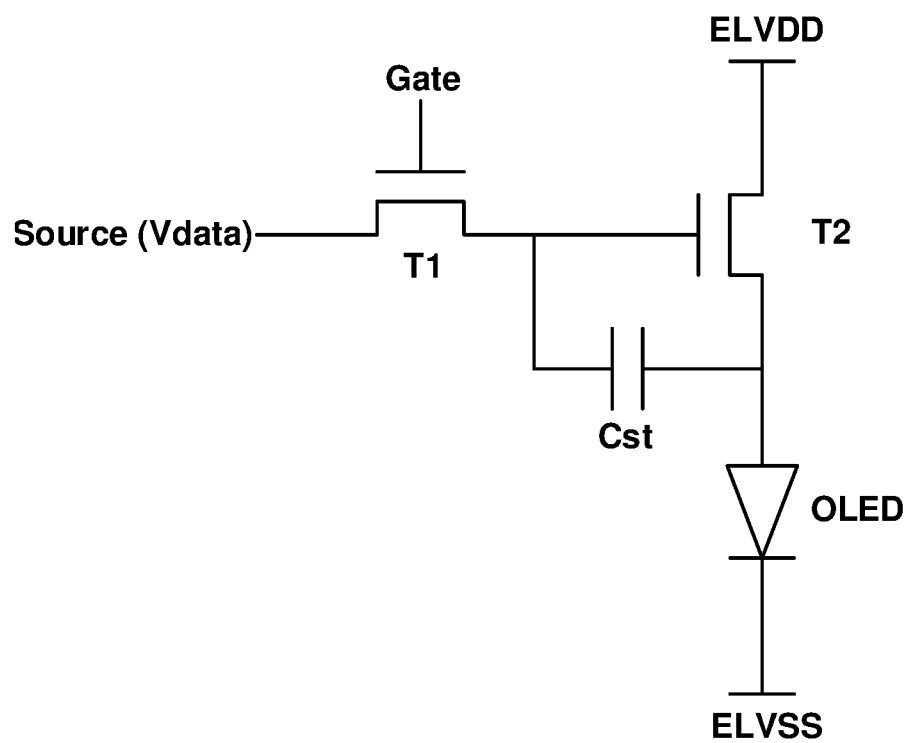
FIG. 1 is a structural diagram of a circuit for driving an AMOLED pixel in the prior art.
Figure 2:
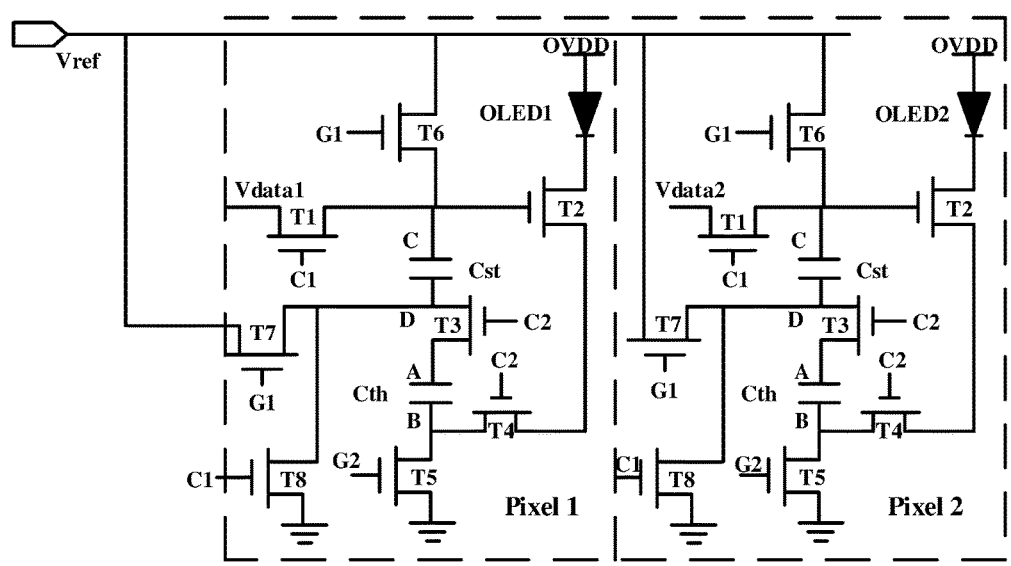
FIG. 2 is a structural diagram of a circuit for driving an AMOLED pixel according to an embodiment of the present disclosure.

In order to compensate a threshold voltage Vth of a drive transistor T2 as shown in FIG. 1, the present disclosure provides a circuit for driving an AMOLED pixel. FIG. 2 is a schematic structural diagram of a drive circuit according to an embodiment of the present disclosure, and the present disclosure will be described in detail below with reference to FIG. 2.

The circuit for driving an AMOLED pixel according to the present disclosure comprises a first transistor T1, a second transistor T2, and a gray-scale storage capacitor Cst. A source of the first transistor T1 is configured to input a gray-scale voltage; a gate of the second transistor T2 is connected to a drain of the first transistor T1, and a source thereof is configured to input a drive voltage so as to drive an OLED; and one end of the gray-scale storage capacitor Cst is connected to the drain of the first transistor T1 for storing the gray-scale voltage. The circuit further comprises a threshold storage capacitor Cth, wherein one end thereof is connected to the other end of the gray-scale storage capacitor Cst, and the other end thereof is connected to a drain of the second transistor T2 for storing a threshold voltage of the second transistor T2. The threshold voltage of the second transistor T2 is compensated by superposing voltages on two ends of the threshold storage capacitor Cth and the gray-scale storage capacitor Cst.

Specifically, as shown in FIG. 2, the first transistor T1 is a switching transistor of the pixel drive circuit; the second transistor T2 is a drive transistor of the pixel drive circuit; the gray-scale storage capacitor Cst is configured to store a gray-scale voltage; and the threshold storage capacitor Cth is configured to store a threshold voltage of the second transistor T2.

According to the present disclosure, the threshold storage capacitor Cth is arranged to store the threshold voltage of the second transistor T2 of a corresponding pixel. By superimposing a threshold voltage stored in the threshold voltage storage capacitor Cth and a gray-scale voltage stored in the gray-scale storage capacitor Cst, the threshold voltage Vth of the second transistor T2 can be compensated, so that an effect of the threshold voltage Vth on OLED current can be reduced, and uniformity of brightness of panel display can be improved.

According to an embodiment of the present disclosure, the circuit further comprises a third transistor, a fourth transistor, a fifth transistor, a sixth transistor, a seventh transistor, and an eighth transistor. The third transistor is arranged between the gray-scale storage capacitor and threshold storage capacitor, wherein a source thereof is connected to the gray-scale storage capacitor, a drain thereof is connected to the threshold storage capacitor, and a gate thereof is configured to input a second control signal. The fourth transistor is arranged between the threshold storage capacitor and a drain of the second transistor, wherein a source thereof is connected to the threshold storage capacitor, a drain thereof is connected to the drain of the second transistor, and a gate thereof is configured to input a second control signal. A source of the fifth transistor is connected to the source of the fourth transistor, a drain thereof is connected to ground, and a gate thereof is configured to input a fourth control signal. A source of the sixth transistor is configured to input a reference voltage, a drain thereof is connected to the drain of the first transistor, and a gate thereof is configured to input a third control signal. A source of the seventh transistor is configured to input the reference voltage, a drain thereof is connected to the source of the third transistor, and a gate thereof is configured to input the third control signal. A source of the eighth transistor is connected to the source of the third transistor, a drain thereof is connected to ground, and a gate thereof is configured to input a first control signal.

Specifically, as a circuit corresponding to pixel 1 in FIG. 2, the third transistor T3 is arranged between the gray-scale storage capacitor Cst and the threshold storage capacitor Cth, wherein a source thereof is connected to the gray-scale storage capacitor Cst, a drain thereof is connected to the threshold storage capacitor Cth, and a gate thereof is configured to input a second control signal C2. The fourth transistor T4 is arranged between the threshold storage capacitor Cth and the drain of the second transistor T2, wherein a source thereof is connected to the threshold storage capacitor Cth, a drain thereof is connected to the drain of the second transistor T2, and a gate thereof is configured to input the second control signal C2. A source of the fifth transistor T5 is connected to the source of the fourth transistor T4, a drain thereof is connected to ground, and a gate thereof is configured to input a fourth control signal G2. A source of the sixth transistor T6 is configured to input a reference voltage Vref, a drain thereof is connected to the drain of the first transistor T1, and a gate thereof is configured to input a third control signal G1. A source of the seventh transistor T7 configured to input the reference voltage Vref, a drain thereof is connected to the source of the third transistor T3, and a gate thereof is configured to input the third control signal G1. A source of the eighth transistor T8 is connected to the source of the third transistor T3, a drain thereof is connected to ground, and a gate thereof is configured to input a first control signal C1. By setting the third to eighth transistors, six in total, in cooperation with first to fourth control signals, four in total and one reference signal, a gray-scale voltage can be stored in a gray-scale storage capacitor, and a threshold voltage of the second transistor can be stored in the threshold storage capacitor. When pixels are lightened, the threshold voltage of the second transistor is compensated by superimposing voltages on two ends of the threshold storage capacitor and the gray-scale storage capacitor, so as to improve uniformity of brightness of pixels.

According to an embodiment of the present disclosure, in order to facilitate connection between transistors in a circuit, a cathode of an OLED is connected to the source of the second transistor T2, and an anode thereof is connected to a drive voltage OVDD. Specifically, as shown in FIG. 2, anodes of OLED1 and OLED2 are connected to the drive voltage OVDD, and cathodes thereof are connected to the source of the second transistor T2.

Figure 3:
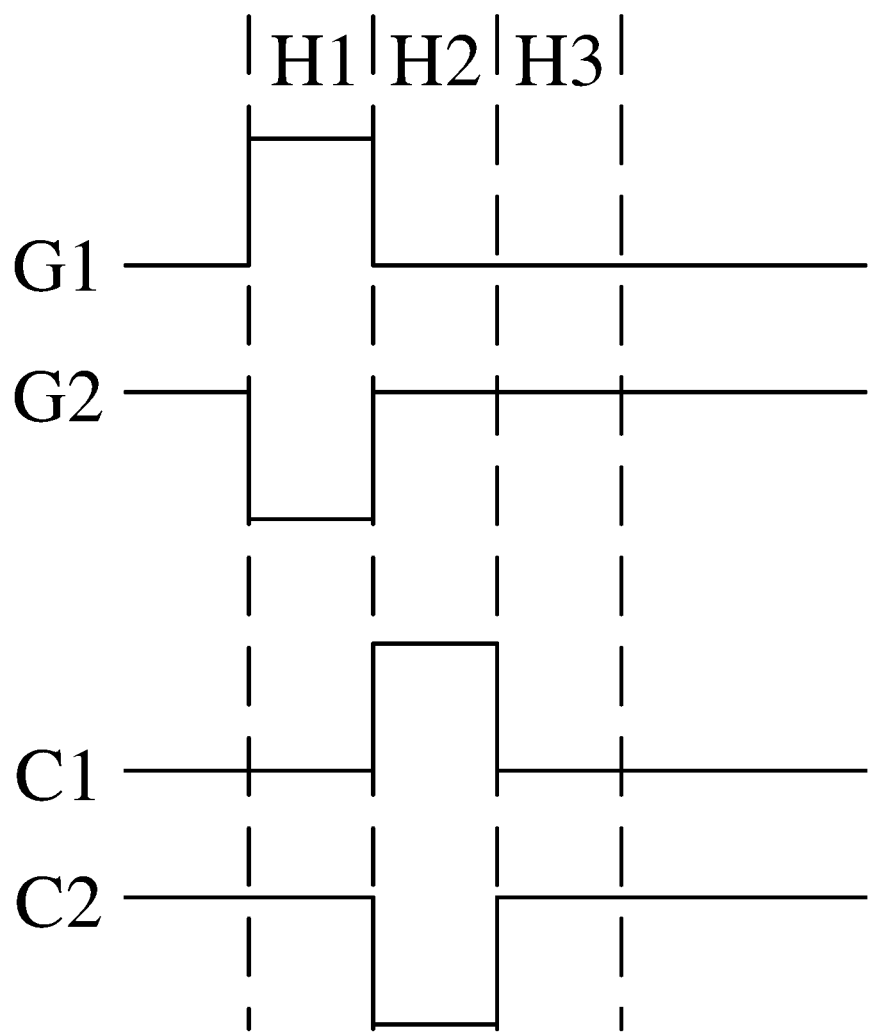
FIG. 3 is a control signal driving time-sequence diagram according to an embodiment of the present disclosure.

According to an embodiment of the present disclosure, a phase of the first control signal is opposite to that of the second control signal, and a phase of the third control signal is opposite to that of the fourth control signal. Specifically, as shown in FIG. 3, a phase of the first control signal C1 is always opposite to that of the second control signal C2, and a phase of the third control signal G1 is always opposite to that of the fourth control signal G2.

In order to realize effective control on the circuit, according to an embodiment of the present disclosure, the first control signal C1, the second control signal C2, the third control signal G1, and the fourth control signal G2 are all set as external input signals. Specifically, as shown in FIG. 2, a needed control signal is introduced in an external signal introduction manner, so as to simplify internal circuit design of a pixel.

According to an embodiment of the present disclosure, the circuit further comprises a phase inverter. The first control signal C1 and the third control signal G1 are external input signals. The second control signal C2 is obtained after phase inversion of the first control signal C1 performed by the phase inverter, and the fourth control signal G2 is obtained after phase inversion of the third control signal G1 performed by the phase inverter. Specifically, according to a phase and time-sequence relationship between the first control signal and the second control signal, and according to a phase and time-sequence relationship between the third control signal and the fourth control signal, a quantity of introduced external signals can be reduced. By setting a phase inverter, a first control signal can be inverted to generate a second control signal, or a second control signal can be inverted to generate a first control signal; a third control signal can be inverted to generate a fourth control signal, or a fourth control signal can be inverted to generate a third control signal.

Figure 7:
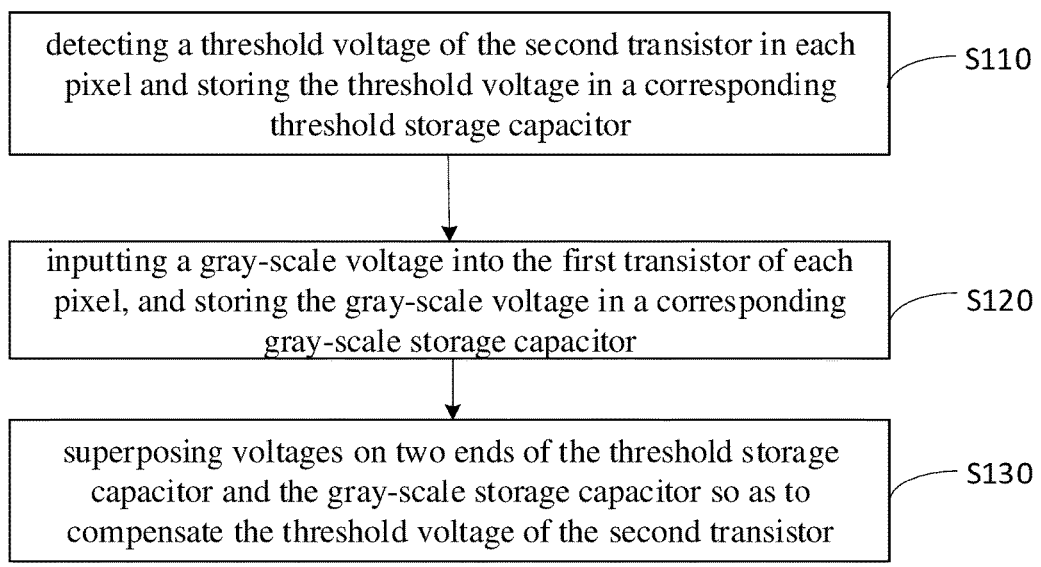
FIG. 7 shows a schematic flow chart of the method in the present disclosure.

According to another aspect, the present disclosure further provides a method for driving an AMOLED pixel, which specifically comprises the following steps. Referring to FIG. 7, which is a schematic flow chart of the method in the present disclosure. First, in step S110, a threshold voltage of the second transistor in each pixel is detected and the threshold voltage is stored in a corresponding threshold storage capacitor. Specifically, a threshold voltage Vth of each pixel can be detected through an existing detection technology, and the threshold voltage Vth is stored in a corresponding threshold storage capacitor Cth. Then, in step S120, a gray-scale voltage is input into the first transistor of each pixel, and the gray-scale voltage is stored in a corresponding gray-scale storage capacitor Cst. Specifically, gray-scale voltage signals Vdata1 and Vdata 2 charge a corresponding gray-scale storage capacitor Cst through a corresponding first transistor T1, so that the gray-scale voltage is stored in the gray-scale storage capacitor Cst. Finally, in step S130, the threshold voltage of the second transistor T2 is compensated through superposing voltages on two ends of the threshold storage capacitor Cth and the gray-scale storage capacitor Cst.

Figure 4:
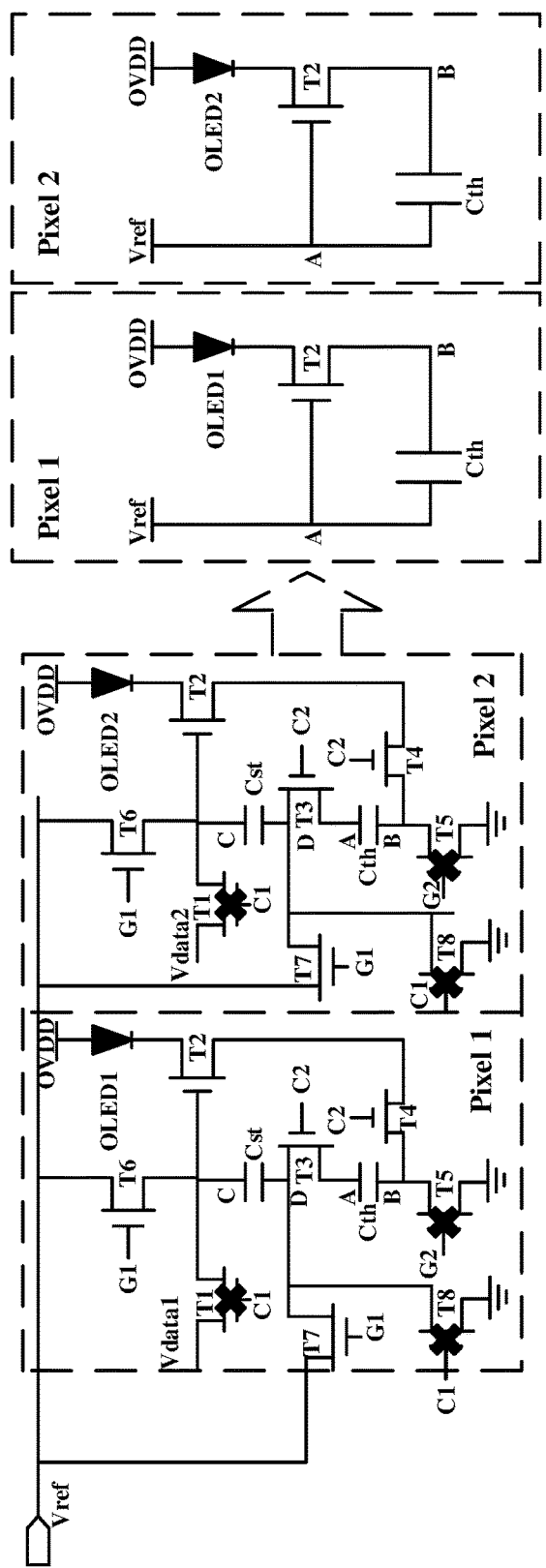
FIG. 4 schematically shows a work state of the circuit as shown in FIG. 2 in a threshold voltage storage stage.
Figure 8:
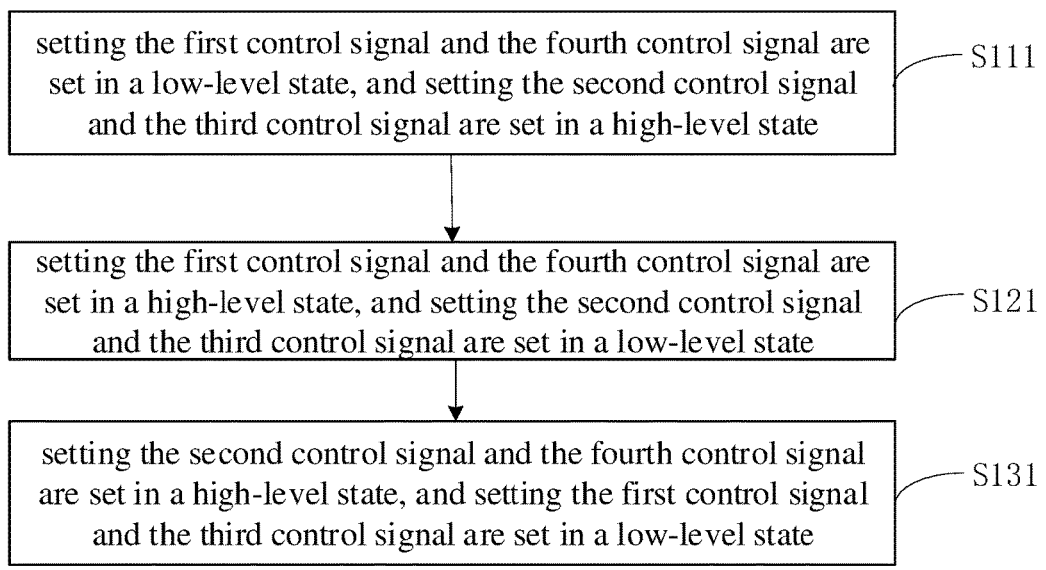
FIG. 8 shows another schematic flow chart of the method in the present disclosure.

Referring to FIG. 8, which is another schematic flow chart of the method in the present disclosure. In step S111, when the threshold voltage of the second transistor T2 is stored in threshold storage capacitor Cth, the first control signal C1 and the fourth control signal G2 are set in a low-level state, while the second control signal C2 and the third control signal G1 are set in a high-level state. At this time, in each pixel, the first transistor T1, the fifth transistor T5, and the eighth transistor T8 are turned off, while the second transistor T2, the third transistor T3, the fourth transistor T4, the sixth transistor T6, and the seventh transistor T7 are turned on, as shown in FIG. 4(a), which corresponds to H1 stage of FIG. 3. An equivalent simplified circuit corresponding to the FIG. 4(a) is shown in FIG. 4(b). In this way, an independent threshold voltage Vth of each pixel can be stored in a corresponding threshold storage capacitor.

Figure 5:
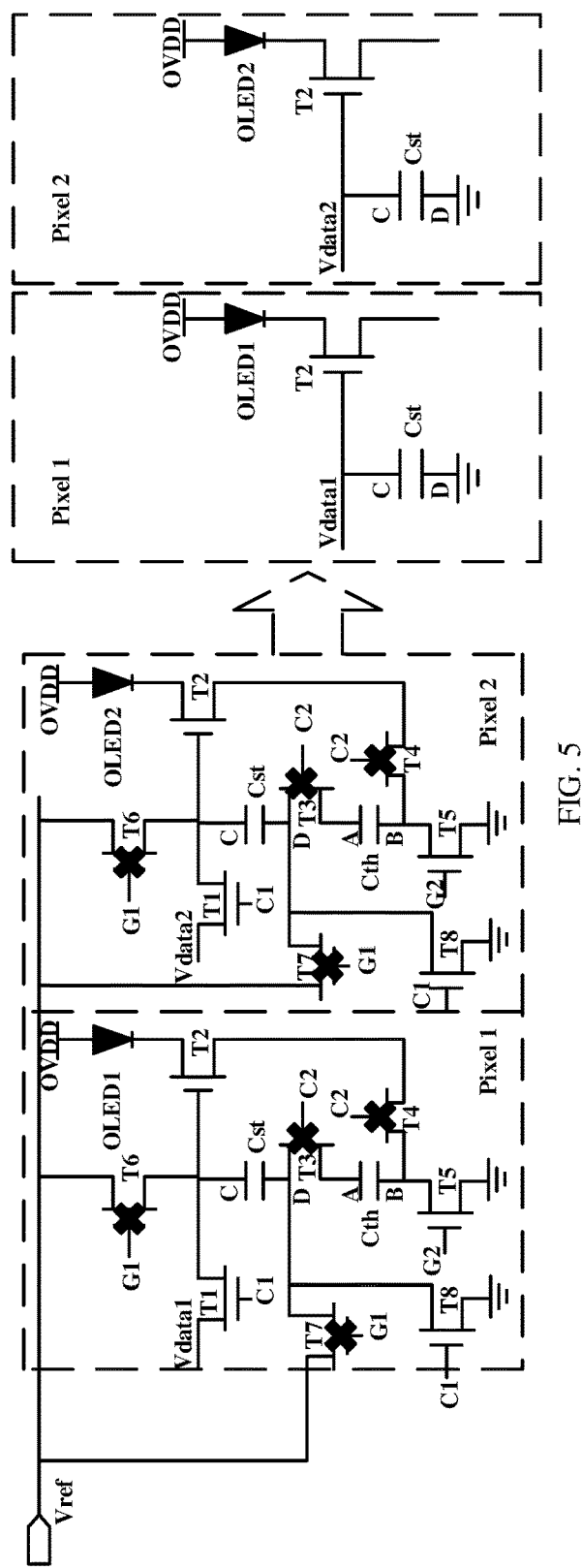
FIG. 5 schematically shows a work state of the circuit as shown in FIG. 2 in a gray-scale voltage storage stage.

In step S121, when the gray-scale voltage is stored in the gray-scale storage capacitor Cst, the first control signal C1 and the fourth control signal G2 are set in a high-level state, while the second control signal C2 and the third control signal G1 are set in a low-level state. At this time, in each pixel, the third transistor T3, the fourth transistor T4, the sixth transistor T6, and the seventh transistor T7 are turned off, and the first transistor T1, the second transistor T2, the fifth transistor T5, and the eighth transistor T8 are turned on, as shown in FIG. 5(a), which corresponds to H2 stage of FIG. 3. An equivalent simplified circuit corresponding to FIG. 5(a) is shown in FIG. 5(b). In this way, a gray-scale voltage can be stored in a corresponding gray-scale storage capacitor Cst.

Figure 6:
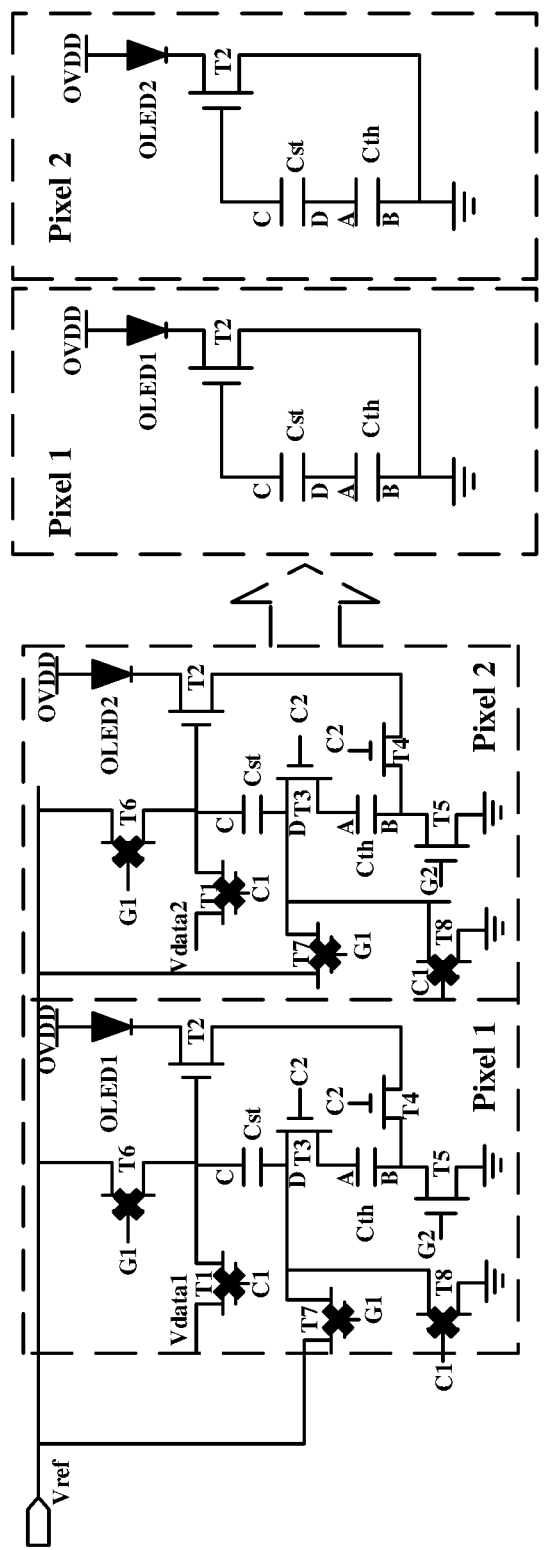
FIG. 6 schematically shows a work state of the circuit as shown in FIG. 2 in a drive transistor threshold voltage compensation stage

In step S131, when the threshold voltage is compensated, the second control signal C2 and the fourth control signal G2 are set in a high-level state, while the first control signal C1 and the third control signal G1 are set in a low-level state. At this time, in each pixel, the first transistor T1, the sixth transistor T6, the seventh transistor T7, and the eighth transistor T8 are turned off, and the second transistor T2, the third transistor T3, the fourth transistor T4, and the fifth transistor T5 are turned on, as shown in FIG. 6(a), which corresponds to H3 stage of FIG. 3. An equivalent simplified circuit corresponding to FIG. 6(a) is shown in FIG. 6(b). In this way, the stored threshold voltage and gray-scale voltage are superimposed to the gate of the drive transistor T2, so that the threshold voltage of the second transistor can be compensated and the OLED can emit light.

According to the present disclosure, the threshold voltage Vth of the drive transistor in an AMOLED display device can be compensated, so that the influence on a display effect of the display device brought about by the non-uniformity of the Vth that is caused in manufacturing procedure and the non-uniform changing of Vth with time can be eliminated. In addition, according to the present disclosure, a time-sequence waveform for driving is simple and can be easily realized.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A circuit for driving an AMOLED pixel, comprising:
a first transistor, a source thereof being configured to input a gray-scale voltage, and a gate thereof being configured to input a first control signal;
a second transistor, a gate thereof being connected to a drain of the first transistor, and a source thereof being configured to input a drive voltage so as to drive an OLED;
a gray-scale storage capacitor, one end thereof being connected to the drain of the first transistor for storing the gray-scale voltage; and
a threshold storage capacitor, one end thereof being connected to the other end of the gray-scale storage capacitor, and the other end thereof being connected to a drain of the second transistor for storing a threshold voltage of the second transistor,
wherein the threshold voltage of the second transistor is compensated by superposing voltages on two ends of the threshold storage capacitor and the gray-scale storage capacitor;
wherein the circuit further comprises:
a third transistor, arranged between the gray-scale storage capacitor and the threshold storage capacitor, a source thereof being connected to the gray-scale storage capacitor, a drain thereof being connected to the threshold storage capacitor, and a gate thereof being configured to input a second control signal;
a fourth transistor, arranged between the threshold storage capacitor and the drain of the second transistor, a source thereof being connected to the threshold storage capacitor, a drain thereof being connected to the drain of the second transistor, and a gate thereof being configured to input the second control signal;
a fifth transistor, a source thereof being connected to the source of the fourth transistor, a drain thereof being connected to ground, and a gate thereof being configured to input a fourth control signal;
a sixth transistor, a source thereof being configured to input a reference voltage, a drain thereof being connected to the drain of the first transistor, and a gate thereof being configured to input a third control signal;
a seventh transistor, a source thereof being configured to input the reference voltage, a drain thereof being connected to the source of the third transistor, and a gate thereof being configured to input the third control signal;
an eighth transistor, a source thereof being connected to the source of the third transistor, a drain thereof being connected to ground, and a gate thereof being configured to input the first control signal;

wherein a cathode of the OLED is connected to the source of the second transistor, and an anode thereof is configured to input a drive voltage;

wherein a phase of the first control signal is opposite to that of the second control signal, and a phase of the third control signal is opposite to that of the fourth control signal;

wherein the circuit further comprises a phase inverter, wherein the first control signal and the third control signal are external input signals; and wherein the second control signal is obtained after phase inversion of the first control signal performed by the phase inverter, and the fourth control signal is obtained after phase inversion of the third control signal performed by the phase inverter.

2. The circuit according to claim 1, wherein the first control signal, the second control signal, the third control signal, and the fourth control signal are all external input signals to the pixel circuit.

3. A method for driving an AMOLED pixel by using the circuit according to claim 1, comprising:

detecting a threshold voltage of the second transistor in each pixel and storing the threshold voltage in a corresponding threshold storage capacitor;

inputting a gray-scale voltage into the first transistor of each pixel, and storing the gray-scale voltage in a corresponding gray-scale storage capacitor; and superposing voltages on two ends of the threshold storage capacitor and the gray-scale storage capacitor so as to compensate the threshold voltage of the second transistor.

4. The method according to claim 3, wherein the step of storing the threshold voltage in a corresponding threshold storage capacitor comprises:

setting the first control signal and the fourth control signal in a low-level state, and setting the second control signal and the third control signal in a high-level state, so that in each pixel, the first transistor, the fifth transistor, and the eighth transistor are turned off, while the second transistor, the third transistor, the fourth transistor, the sixth transistor, and the seventh transistor are turned on.

5. The method according to claim 3, wherein the step of storing the gray-scale voltage in a corresponding gray-scale storage capacitor comprises:

setting the first control signal and the fourth control signal in a high-level state, and setting the second control signal and the third control signal are set in a low-level state, so that in each pixel, the third transistor, the fourth transistor, the sixth transistor, and the seventh transistor are turned off, while the first transistor, the second transistor, the fifth transistor, and the eighth transistor are turned on.

6. The method according to claim 3, wherein the step of compensating the threshold voltage of the second transistor comprises:

setting the second control signal and the fourth control signal in a high-level state, and setting the first control signal and the third control signal in a low-level state, so that in each pixel, the first transistor, the sixth transistor, the seventh transistor, and the eighth transistor are turned off, while the second transistor, the third transistor, the fourth transistor, and the fifth transistor are turned on.

* * * * *